US009740418B2

(12) United States Patent
Lin et al.

(10) Patent No.: US 9,740,418 B2
(45) Date of Patent: Aug. 22, 2017

(54) STORAGE UNIT, MEMORY, AND METHOD FOR CONTROLLING STORAGE UNIT

(71) Applicant: Huawei Technologies Co., Ltd., Shenzhen, Guangdong (CN)

(72) Inventors: Yinyin Lin, Shanghai (CN); Zhulin Wei, Shenzhen (CN); Junfeng Zhao, Shenzhen (CN); Wei Yang, Hangzhou (CN); Yarong Fu, Shanghai (CN); Kai Yang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/133,897

(22) Filed: Apr. 20, 2016

(65) Prior Publication Data

US 2016/0231959 A1 Aug. 11, 2016

Related U.S. Application Data

(63) Continuation of application No. PCT/CN2014/088668, filed on Oct. 15, 2014.

(30) Foreign Application Priority Data

Oct. 21, 2013 (CN) .......................... 2013 1 0496697

(51) Int. Cl.
  *G06F 3/06* (2006.01)
  *G11C 8/16* (2006.01)
  (Continued)

(52) U.S. Cl.
  CPC .......... *G06F 3/0625* (2013.01); *G06F 3/0658* (2013.01); *G06F 3/0676* (2013.01); (Continued)

(58) Field of Classification Search
  CPC .... G06F 3/0625; G06F 3/0658; G06F 3/0676; G11C 8/16; G11C 11/161; G11C 19/0808; G11C 19/0841
  (Continued)

(56) References Cited

U.S. PATENT DOCUMENTS 6,834,005 B1 12/2004 Parkin
7,551,469 B1 6/2009 Parkin
(Continued)

FOREIGN PATENT DOCUMENTS

CN 1691200 A 11/2005
CN 101114693 A 1/2008
(Continued)

OTHER PUBLICATIONS

Stuart S. P. Parkin et al., "Magnetic Domain-Wall Racetrack Memory", Science, vol. 320, Apr. 11, 2008, p. 190-194.

*Primary Examiner* — Stephen Elmore

(57) ABSTRACT

A storage unit includes a U-shaped magnetic track, a first drive circuit, a second drive circuit, a first drive port, and a second drive port. The U-shaped magnetic track includes a first port, a second port, a first storage area, and a second storage area. By controlling input voltages of the first port, the second port, the first drive port, and the second drive port and driving the first drive circuit, a current pulse is generated in the first storage area, and a magnetic domain wall in the first storage area is driven to move. By controlling the input voltages of the first port, the second port, the first drive port, and the second drive port and driving the second drive circuit, a current pulse is generated in the second storage area, and a magnetic domain in the second storage area is driven to move.

12 Claims, 2 Drawing Sheets

(51) Int. Cl.
*G11C 11/16* (2006.01)
*G11C 19/08* (2006.01)

(52) U.S. Cl.
CPC .............. *G11C 8/16* (2013.01); *G11C 11/161* (2013.01); *G11C 19/0808* (2013.01); *G11C 19/0841* (2013.01)

(58) Field of Classification Search
USPC ...... 711/111, 154; 365/18, 33, 55, 130, 173; 369/13.47, 13.52
See application file for complete search history.

(56) References Cited

U.S. PATENT DOCUMENTS

| | | |
|---|---|---|
| 7,667,994 B1 | 2/2010 | Moriya et al. |
| 7,710,757 B2 * | 5/2010 | Kim ........................ G11C 11/14 365/130 |
| 7,855,908 B2 * | 12/2010 | Joe ..................... G11C 19/0841 365/80 |
| 8,374,052 B2 * | 2/2013 | Kim ........................ G11C 11/14 365/158 |
| 2005/0186686 A1 | 8/2005 | Chen et al. |
| 2008/0025060 A1 | 1/2008 | Lim et al. |
| 2008/0068880 A1 | 3/2008 | Lim et al. |
| 2010/0172169 A1 | 7/2010 | Lee et al. |
| 2010/0232055 A1 | 9/2010 | Lee et al. |

FOREIGN PATENT DOCUMENTS

| | | |
|---|---|---|
| CN | 101145571 A | 3/2008 |
| CN | 101770803 A | 7/2010 |
| EP | 2073213 A1 | 6/2009 |
| EP | 3048611 A1 | 7/2016 |
| JP | 2007273064 A | 10/2007 |
| JP | 2010218678 | 9/2010 |
| KR | 100790886 | 1/2008 |
| KR | 20100104044 | 9/2010 |

\* cited by examiner

STORAGE UNIT, MEMORY, AND METHOD FOR CONTROLLING STORAGE UNIT

CROSS-REFERENCE TO RELATED APPLICATIONS

This application is a continuation of International Application No. PCT/CN2014/088668, filed on Oct. 15, 2014, which claims priority to Chinese Patent Application No. 201310496697.1, filed on Oct. 21, 2013, both of which are hereby incorporated by reference in their entireties.

TECHNICAL FIELD

The present invention relates to the field of data storage technologies, and in particular, to a storage unit, a memory, and a method for controlling a storage unit.

BACKGROUND

Generally, there are two data storage manners: flash memory storage and hard disk storage. A flash memory has a high read speed, a small capacity, and a high price. A hard disk has a low read/write speed, but has a large capacity and a low price. Based on this, at present, there exists a new storage manner, that is, a nano-scale track, which has features including high performance of a flash memory, and a low cost and a high capacity of a hard disk.

An existing nano-scale track is made of magnetic materials and includes multiple magnetic areas, that is, magnetic domains, where neighboring magnetic domains are separated by a magnetic domain wall, and the multiple magnetic areas and the magnetic domain wall form a U-shaped storage track. A high-voltage drive circuit is disposed at two ends of the top of the track, to generate a current pulse that drives the magnetic domain wall to move, and the magnetic domain wall moves along the track under an action of the current pulse, so that the magnetic domains move.

If the U-shaped nano-scale track includes 2N magnetic domains (N is a positive integer greater than or equal to 1), when the magnetic domain wall moves, a right track needs to accommodate data info/nation of a left track, and therefore, the 2N magnetic domains can store only N-bit data, and storage density is low; in addition, to drive 2N magnetic domain walls to move along the magnetic track, a voltage applied to the high-voltage drive circuit at the two ends of the top of the track is high, and power consumption of a memory is large.

SUMMARY

Embodiments of the present invention provide a storage unit, a memory, and a method for controlling a storage unit, to increase storage density and reduce power consumption.

A first aspect of the present invention provides a storage unit, where the storage unit may include:

a U-shaped magnetic track, a first drive circuit, a second drive circuit, a first drive port connected to the first drive circuit, and a second drive port connected to the second drive circuit, where:

the U-shaped magnetic track includes a first port that is disposed at one end of the top of the U-shaped magnetic track and that is connected to a cathode bus, a second port that is disposed at the other end of the top of the U-shaped magnetic track and that is connected to an anode bus, a first storage area, and a second storage area;

the first drive circuit is configured to drive the first storage area, and the second drive circuit is configured to drive the second storage area;

by controlling input voltages of the first port, the second port, the first drive port, and the second drive port and driving the first drive circuit, a current pulse is generated in the first storage area, and a magnetic domain in the first storage area is driven to move; and by controlling the input voltages of the first port, the second port, the first drive port, and the second drive port and driving the second drive circuit, a current pulse is generated in the second storage area, and a magnetic domain in the second storage area is driven to move.

In a first possible implementation manner of the first aspect, the first drive circuit includes a first gate port, and the second drive circuit includes a second gate port, where the first gate port is configured to control, according to a value of a voltage applied to the first gate port, to connect or disconnect the first drive circuit, and the second gate port is configured to control, according to a value of a voltage applied to the second gate port, to connect or disconnect the second drive circuit.

In a second possible implementation manner of the first aspect, the first storage area is disposed between the first port and the second drive circuit, and the second storage area is disposed between the second port and the first drive circuit.

With reference to the first aspect, or the first implementation manner or the second possible implementation manner of the first aspect, in a third possible implementation manner, the storage unit further includes a write circuit and a read circuit that are disposed at the bottom of the U-shaped magnetic track, where the write circuit is configured to perform a write operation on the first storage area and the second storage area, and the read circuit is configured to perform a read operation on the first storage area and the second storage area.

With reference to the third possible implementation manner of the first aspect, in a fourth possible implementation manner, the storage unit further includes a storage module connected to the read circuit, where the storage module is configured to: when the magnetic domain in the first storage area or the second storage area moves, store data that moves out from the U-shaped magnetic track.

A second aspect of the present invention provides a memory, where the memory may include a storage unit.

The storage unit may include:

a U-shaped magnetic track, a first drive circuit, a second drive circuit, a first drive port connected to the first drive circuit, and a second drive port connected to the second drive circuit, where:

the U-shaped magnetic track includes a first port that is disposed at one end of the top of the U-shaped magnetic track and that is connected to a cathode bus, a second port that is disposed at the other end of the top of the U-shaped magnetic track and that is connected to an anode bus, a first storage area, and a second storage area;

the first drive circuit is configured to drive the first storage area, and the second drive circuit is configured to drive the second storage area;

by controlling input voltages of the first port, the second port, the first drive port, and the second drive port and driving the first drive circuit, a current pulse is generated in the first storage area, and a magnetic domain in the first storage area is driven to move; and by controlling the input voltages of the first port, the second port, the first drive port, and the second drive port and driving the second drive circuit, a current pulse is generated in the second storage area, and a magnetic domain in the second storage area is driven to move.

With reference to the second aspect, in a first possible implementation manner, the first drive circuit includes a first gate port, and the second drive circuit includes a second gate port, where the first gate port is configured to control, according to a value of a voltage applied to the first gate port, to connect or disconnect the first drive circuit, and the second gate port is configured to control, according to a value of a voltage applied to the second gate port, to connect or disconnect the second drive circuit.

In a second possible implementation manner of the second aspect, the first storage area is disposed between the first port and the second drive circuit, and the second storage area is disposed between the second port and the first drive circuit.

With reference to the second aspect, or the first implementation manner or the second possible implementation manner of the second aspect, in a third possible implementation manner, the storage unit further includes a write circuit and a read circuit that are disposed at the bottom of the U-shaped magnetic track, where the write circuit is configured to perform a write operation on the first storage area and the second storage area, and the read circuit is configured to perform a read operation on the first storage area and the second storage area.

With reference to the third possible implementation manner of the second aspect, in a fourth possible implementation manner, the storage unit further includes a storage module connected to the read circuit, where the storage module is configured to: when the magnetic domain in the first storage area or the second storage area moves, store data that moves out from the U-shaped magnetic track.

A third aspect of the present invention provides a method for controlling a storage unit, where the method is applied to the foregoing storage unit and the method may include:

by controlling input voltages of a first port, a second port, a first drive port, and a second drive port that are of the storage unit and driving a first drive circuit, controlling to generate a current pulse in a first storage area of the storage unit, and driving a magnetic domain in the first storage area to move; and by controlling the input voltages of the first port, the second port, the first drive port, and the second drive port and driving a second drive circuit, controlling to generate a current pulse in a second storage area of the storage unit, and driving a magnetic domain in the second storage area to move.

With reference to the third aspect, in a first possible implementation manner, the method further includes:

connecting the first drive circuit or connecting the second drive circuit according to values of input voltages of a first gate port and a second gate port that are of the storage unit.

It can be seen from the foregoing technical solutions that, the storage unit, the memory, and the method for controlling a storage unit that are provided in the embodiments of the present invention have the following advantages: two storage areas in the storage unit are both used to store data, which increases storage density; in addition, a current pulse provided by a drive circuit in the storage unit needs to drive only a magnetic domain wall of a storage area on one end of a track, and therefore, a drive voltage is reduced and power consumption is also reduced.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

Embodiments of the present invention provide a storage unit, a memory, and a method for controlling a storage unit, to increase storage density and reduce power consumption.

To make the invention objectives, features, and advantages of the present invention clearer and more comprehensible, the following clearly and describes the technical solutions in the embodiments of the present invention with reference to the accompanying drawings in the embodiments of the present invention. Apparently, the embodiments described in the following are merely some but not all of the embodiments of the present invention. All other embodiments obtained by a person of ordinary skill in the art based on the embodiments of the present invention without creative efforts shall fall in the protection scope of the present invention.

In the specification, claims, and accompanying drawings of the present invention, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of the present invention described herein can, for example, be implemented in orders except the order illustrated or described herein. Moreover, the terms "include", "contain" and any other variants mean to cover the non-exclusive inclusion, for example, a process, method, system, product, or device that includes a list of steps or units is not necessarily limited to those steps or units, but may include other steps or units not expressly listed or inherent to such a process, method, system, product, or device.

Detailed descriptions are provided separately in the following by using specific embodiments.

Figure 1:
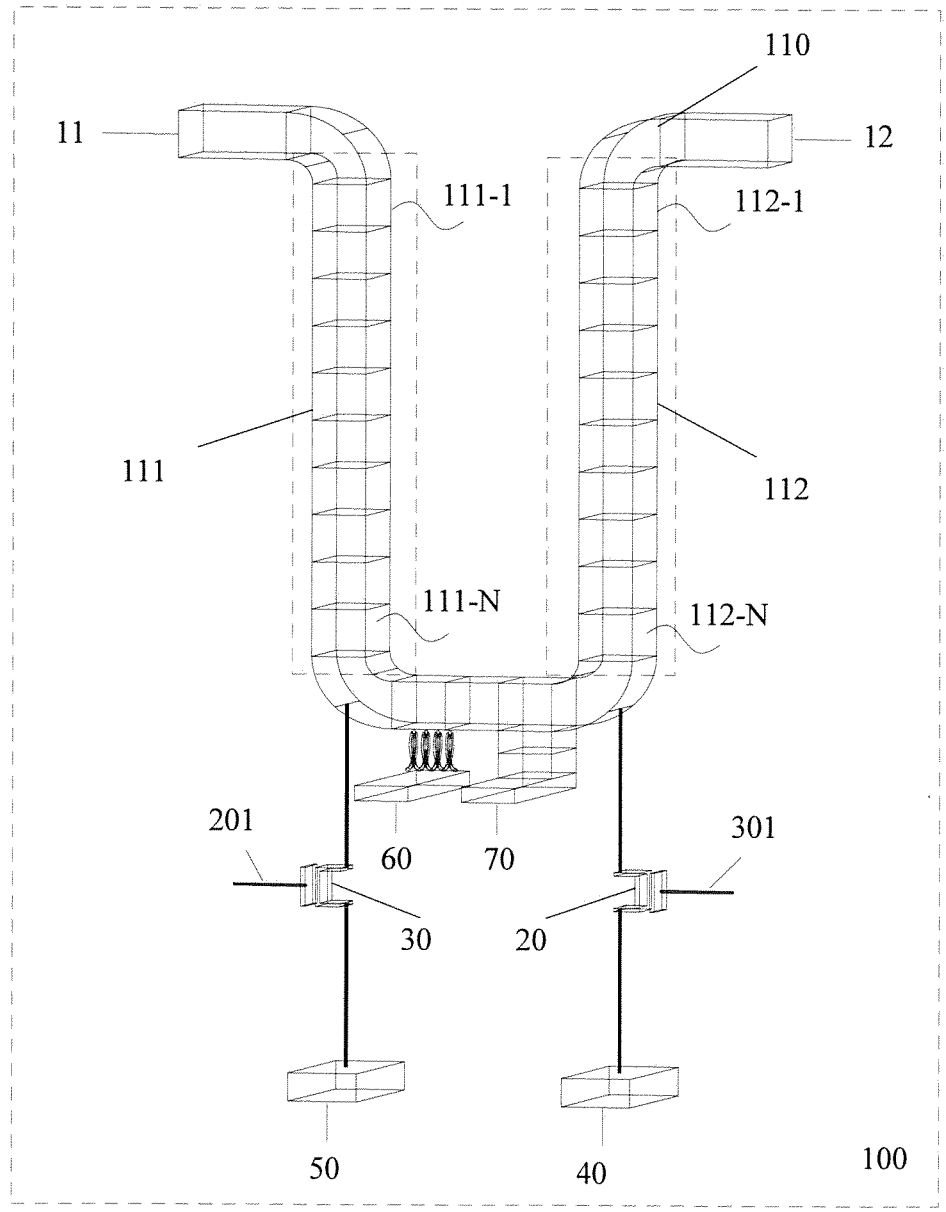
FIG. 1 is a schematic structural diagram of a storage unit according to an embodiment of the present invention.

Referring to FIG. 1, FIG. 1 is a schematic structural diagram of a storage unit 100 according to an embodiment of the present invention, where the storage unit 100 may be disposed in an X-bar shape and may include:

a U-shaped magnetic track 110, a first drive circuit 20 and a second drive circuit 30 that are located at the bottom of the U-shaped magnetic track 110, a first drive port 40 connected to the first drive circuit 20, and a second drive port 50 connected to the second drive circuit 30.

The U-shaped magnetic track 110 includes a first port 11 that is disposed at one end of the top of the U-shaped magnetic track 110 and that is connected to a cathode bus, a second port 12 that is disposed at the other end of the top of the U-shaped magnetic track 110 and that is connected to an anode bus, a first storage area 111, and a second storage area 112.

The first drive circuit 20 is configured to drive the first storage area 111, and the second drive circuit 30 is configured to drive the second storage area 112.

Preferably, the first storage area 111 is disposed between the first port 11 and the second drive circuit 30, and the second storage area 112 is disposed between the second port 12 and the first drive circuit 20. The storage unit shown in FIG. 1 is used as an example. It is assumed that both the first storage area 111 and the second storage area 112 include N (N is a positive integer greater than or equal to 1) memory blocks, where 111-1 shown in the figure is a first magnetic storage area block of the first storage area 111, 112-1 shown in the figure is a first magnetic storage area block of the second storage area 112, 111-N shown in the figure is a last magnetic storage area block of the first storage area 111, and 112-N shown in the figure is a last magnetic storage area block of the second storage area 112. In addition, it is easily figured out that in this embodiment of the present invention, the schematic structural diagram of the storage unit shown in FIG. 1 is merely used for analysis and description, which does not constitute a limitation on the present invention.

It may be understood that both the first drive circuit 20 and the second drive circuit 30 may be designed as a transistor of a metal-oxide semiconductor (MOS) structure or a transistor of a CMOS structure or a drive circuit consisting of the CMOS structure, which is not specifically limited herein.

By controlling input voltages of the first port 11, the second port 12, the first drive port 40, and the second drive port 50 and driving the first drive circuit 20, a current pulse is generated in the first storage area 111, and a magnetic domain in the first storage area 111 is driven to move.

When the first drive circuit 20 is driven, and a current pulse is generated in the first storage area 111, a magnetic domain wall in the first storage area 111 is driven to move, thereby driving a magnetic domain in the first storage area 111 to move. In addition, to save energy and ensure that the first storage area 111 works properly, the second drive circuit 30 is disconnected, that is, the second drive circuit 30 does not work.

By controlling the input voltages of the first port 11, the second port 12, the first drive port 40, and the second drive port 50 and driving the second drive circuit 30, a current pulse is generated in the second storage area 112, and a magnetic domain in the second storage area 112 is driven to move.

When the second drive circuit 30 is driven, and a current pulse is generated in the second storage area 112, a magnetic domain wall in the second storage area 112 is driven to move, thereby driving a magnetic domain in the second storage area 112 to move. In addition, to save energy and ensure that the second storage area 112 works properly, the first drive circuit 20 is disconnected, that is, the first drive circuit 20 does not work.

It can be known from the foregoing that, 2N magnetic domains in an existing magnetic track can store only N-bit data, and in addition, to drive 2N magnetic domain walls to move, a voltage applied to a high-voltage drive circuit at two ends of the top of the track is relatively high, and as a result, power consumption of a memory is large. Compared with this, two storage areas in the storage unit 100 provided in this embodiment of the present invention are both used for storing data, that is, 2N magnetic domains can store 2N-bit data, which increases storage density; in addition, a current pulse provided by a drive circuit in the storage unit 100 needs to drive only a magnetic domain wall of a storage area on one side of a track to move, and therefore, a drive voltage can be reduced, and power consumption can also be reduced.

Further, as shown in FIG. 1, the first drive circuit 20 includes a first gate port 201, and the second drive circuit 30 includes a second gate port 301, where the first gate port 201 is configured to control, according to a value of a voltage applied to the first gate port 201, to connect or disconnect the first drive circuit 20, and the second gate port 301 is configured to control, according to a value of a voltage applied to the second gate port 301, to connect or disconnect the second drive circuit 30.

It should be noted that, for the first storage area 111, if, by controlling the input voltages of the first port 11, the second port 12, the first drive port 40, and the second drive port 50, a voltage difference between two ends (that is, the first port 11 and the second drive port 50) of the first storage area 111 is greater than or equal to a voltage threshold for driving a magnetic domain to move and a voltage difference between two ends (that is, the second port 12 and the first drive port 40) of the second storage area 112 is less than the voltage threshold for driving a magnetic domain to move, and in addition, a value of a voltage of the first gate port 201 is controlled to connect the first drive circuit 20 and a value of a voltage of the second gate port 301 is controlled to disconnect the second drive circuit 30, then under driving of the first drive circuit 20, a current pulse is generated in the first storage area 111, and a magnetic domain in the first storage area 111 is driven to move, thereby completing a read operation or a write operation on the first storage area 111. In addition, it is easily figured out that a voltage at two ends of a storage area in the storage unit 100 is proportional to a moving distance of a magnetic domain, that is, when a moving distance becomes longer, to maintain a same moving speed of a magnetic domain, it is required to increase the voltage at the two ends of the corresponding storage area.

In this embodiment of the present invention, a voltage of each port of the storage unit 100 is controlled, so that the first storage area 111 and the second storage area 112 do not work at the same time, that is, a read operation or a write operation is controlled to be performed on only one storage area each time.

It may be understood that, for a control operation of the second storage area 112, reference may be made to a control process of the foregoing first storage area 111, and details are not described herein again.

Still further, the storage unit 100 further includes a write circuit 60 and a read circuit 70 that are disposed at the bottom of the U-shaped magnetic track 110, where the write circuit 60 is configured to perform a write operation on the first storage area 111 and the second storage area 112, and the read circuit 70 is configured to perform a read operation on the first storage area 111 and the second storage area 112.

It should be noted that, a storage principle of a storage area in the U-shaped magnetic track 110 is that information is stored by moving a magnetic domain. Preferably, because the first drive circuit 20 and the second drive circuit 30 are disposed at the bottom of the U-shaped magnetic track 110 to respectively drive a magnetic domain in the first storage area 111 and a magnetic domain in the second storage area 112 to move, 2N magnetic domains can store 2N-bit data.

It may be understood that, that a whole of the first drive circuit 20, the second drive circuit 30, the write circuit 60, and the read circuit 70 is translated to another position of the U-shaped magnetic track 110 may also be implemented, however, in consideration of an integrated circuit technology, for a three-dimensional structure consisting of a drive circuit, a read circuit, and a write circuit, the first drive circuit 20, the second drive circuit 30, the write circuit 60, and the read circuit 70 are placed at the bottom of the track, which is easy for implementation and reduces an area.

The storage unit 100 further includes a storage module connected to the read circuit 70, where the storage module is configured to: when a magnetic domain in the first storage area 111 or the second storage area 112 moves, store data that moves out from the U-shaped magnetic track 110.

In this embodiment of the present invention, for a better understanding of the technical solution of the present invention, the following provides a specific application scenario to analyze and describe an operating principle of the storage unit 100.

In the application scenario, by controlling input voltages of a cathode bus port (that is, the first port 11), an anode bus port (that is, the second port 12), the first drive port 40, and the second drive port 50 and driving a MOS drive circuit (the first drive circuit 20 or the second drive circuit 30), a current pulse may be generated in the U-shaped magnetic track 110 (the first storage area 111 or the second storage area 112), and a magnetic domain wall is driven to move. Data writing is performed by using the write circuit 60 at the bottom of the track, and data reading is performed by using the read circuit 70 at the bottom of the track.

Specifically, reference may be made to the schematic structural diagram of the storage unit 100 shown in FIG. 1 and reference may also be made to Table 1. Table 1 describes port voltage control of the storage unit 100.

First, a voltage −Vpp is applied to the cathode bus port (that is, the first port 11), no voltage is applied to the anode bus port (that is, the second port 12), a voltage +Vpp is applied to a MOS drive circuit port (that is, the first drive port 40) on one side of the second storage area 112, and no voltage is applied to a MOS drive circuit port (that is, the second drive port 50) of one side of the first storage area 111. When a value of a voltage of the first gate port 201 at the bottom of the U-shaped magnetic track 110 is controlled so as to connect the first drive circuit 20 (a value of a voltage of the second gate port 301 is controlled at the same time so as to disconnect the second drive circuit 30), then under driving of the first drive circuit 20, a current pulse is generated in the first storage area 111, and a magnetic domain in the first storage area 111 moves. Because a moving direction of the magnetic domain is opposite to a direction of a current, the magnetic domain in the first storage area 111 moves from the cathode bus to the write circuit 60 and the read circuit 70.

It may be understood that, if a voltage +Vpp is applied to the first port 11, a voltage −Vpp is applied to the first drive port 40, and no voltage is applied to the second port 12 and the second drive port 50, then under driving of the first drive circuit 20, a magnetic domain in the first storage area 111 moves in a direction from the write circuit 60 and the read circuit 70 to the cathode bus.

If a voltage +Vpp is applied to the second port 12, a voltage −Vpp is applied to the second drive port 50, and no voltage is applied to the first port 11 and the first drive port 40, when a value of a voltage of the second gate port 301 at the bottom of the U-shaped magnetic track 110 is controlled so as to connect the second drive circuit 30 (a value of a voltage of the first gate port 201 is controlled at the same time so as to disconnect the first drive circuit 20), then under driving of the second drive circuit 30, a current pulse is generated in the second storage area 112, and a maynetic domain in the second storage area 112 moves. Because a moving direction of the magnetic domain is opposite to a direction of a current, the magnetic domain in the second storage area 112 moves from the write circuit 60 and the read circuit 70 to the anode bus.

TABLE 1

| Port | 11 | 12 | 40 | 50 | Effect |
|---|---|---|---|---|---|
| | −Vpp | 0 | +Vpp | 0 | A magnetic domain wall moves from the cathode bus to the write circuit 60 and the read circuit 70 |
| | 0 | +Vpp | 0 | −Vpp | A magnetic domain wall moves from the write circuit 60 and the read circuit 70 to the anode bus |

It should be noted that, a value of a voltage |±Vpp| is not high enough to generate a current pulse that enables a magnetic area to move, and a voltage 2|±Vpp| is greater than or equal to the voltage threshold for driving a magnetic domain to move, and therefore, the first storage area 111 and the second storage area 112 do not work at the same time by controlling a voltage of each port of the storage unit 100, that is, a read operation or a write operation is controlled to be performed on only one storage area each time.

It may be understood that, operating principles of the write circuit 60 and the read circuit 70 that are of the storage unit 100 provided in this embodiment of the present invention are the same as that of read and write apparatuses that are of an existing magnetic track, and details are not described herein again.

In addition, it is easily figured out that in this embodiment of the present invention, a structure of the storage unit shown in FIG. 1 and a read/write operation control process of the storage unit are used merely for analysis and description, which does not constitute a limitation on the present invention.

It can be known from the foregoing that, 2N magnetic domains in an existing magnetic track can store only N-bit data, and in addition, to drive 2N magnetic domain walls to move, a voltage applied to a high-voltage drive circuit at two ends of the top of the track is relatively high, and as a result, power consumption of a memory is large. Compared with this, two storage areas in the storage unit 100 provided in this embodiment of the present invention are both used for storing data, that is, 2N magnetic domains can store 2N-bit data, which increases storage density; in addition, a current pulse provided by a drive circuit in the storage unit 100 needs to drive only a magnetic domain wall of a storage area on one side of a track to move, and therefore, a drive voltage can be reduced, and power consumption can also be reduced.

To better implement the storage unit 100 provided in this embodiment of the present invention, an embodiment of the present invention further provides a memory that is based on the foregoing storage unit 100 and a method for controlling the storage unit 100. Meanings of nouns are the same as those in the foregoing storage unit 100. For specific implementation details, reference may be made to descriptions in the foregoing embodiment.

Figure 2:
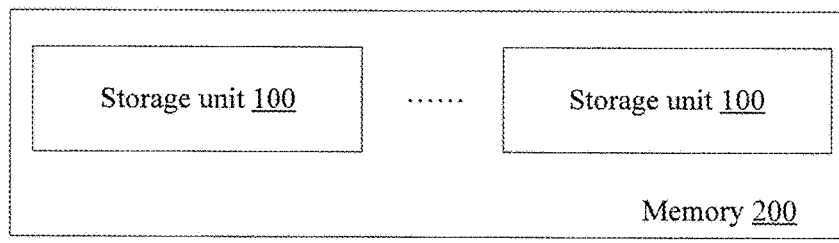
FIG. 2 is a schematic structural diagram of a memory according to an embodiment of the present invention.

An embodiment of the present invention further provides a memory 200. Referring to FIG. 2, FIG. 2 is a schematic structural diagram of the memory 200. The memory 200 includes at least one storage unit 100 described in the foregoing embodiment.

It may be understood that, specific structure settings and an operating principle that are of the storage unit 100 may be specifically implemented according to related content of the foregoing embodiment, and details are not described herein again.

It can be known from the foregoing that, 2N magnetic domains in an existing magnetic track can store only N-bit data, and in addition, to drive 2N magnetic domain walls to move, a voltage applied to a high-voltage drive circuit at two ends of the top of the track is relatively high, and as a result, power consumption of a memory is large. Compared with this, the memory 200 provided in this embodiment of the present invention includes at least two storage units 100, and two storage areas in the storage unit 100 are both used for storing data, that is, 2N magnetic domains can store 2N-bit data, which increases storage density; in addition, a current pulse provided by a drive circuit in the storage unit 100 needs to drive only a magnetic domain wall of a storage area on one side of a track to move, and therefore, a drive voltage can be reduced, and power consumption can also be reduced.

Figure 3:
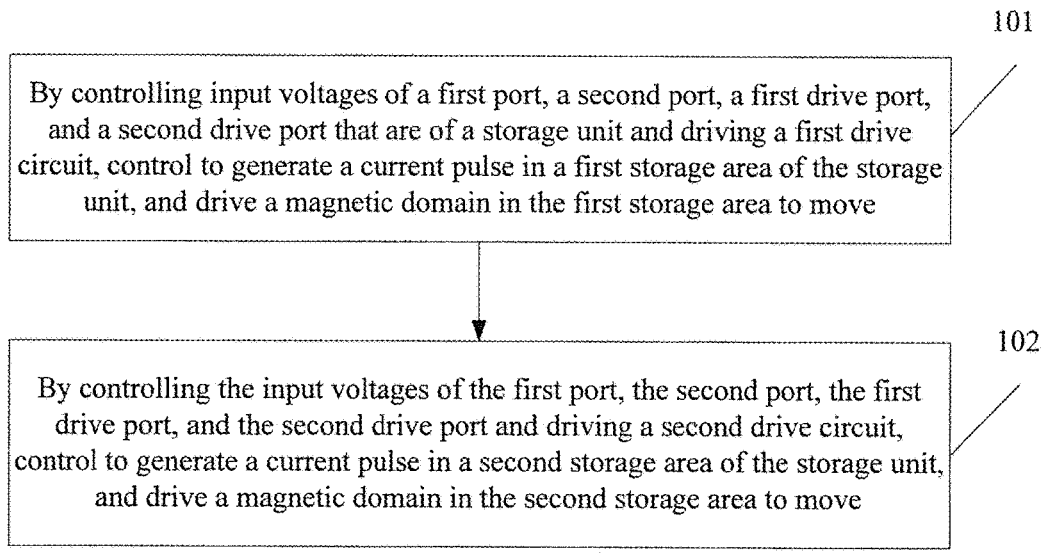
FIG. 3 is a schematic flowchart of a method for controlling a storage unit according to an embodiment of the present invention.

Referring to FIG. 3, FIG. 3 is a schematic flowchart of a method for controlling a storage unit 100 according to an embodiment of the present invention. The method is applied to the storage unit 100 provided in the foregoing embodiment, and reference may also made to the schematic structural diagram of the storage unit 100 shown in FIG. 1. The method includes the following steps:

Step 101: By controlling input voltages of a first port 11, a second port 12, a first drive port 40, and a second drive port 50 that are of the storage unit 100 and driving a first drive circuit 20, control to generate a current pulse in a first storage area 111 of the storage unit 100, and drive a magnetic domain in the first storage area 111 to move.

Step 102: By controlling the input voltages of the first port 11, the second port 12, the first drive port 40, and the second drive port 50 that are of the storage unit 100 and driving a second drive circuit 30, control to generate a current pulse in a second storage area 112 of the storage unit 100, and drive a magnetic domain in the second storage area 112 to move.

It may be understood that the storage unit 100 may be disposed in an X-bar shape and may include: a U-shaped magnetic track 110, the first drive circuit 20, the second drive circuit 30, the first drive port 40 connected to the first drive circuit 20, and the second drive port 50 connected to the second drive circuit 30, where the U-shaped magnetic track 110 includes the first port 11 that is disposed at one end of the top of the U-shaped magnetic track 110 and that is connected to a cathode bus, the second port 12 that is disposed at the other end of the top of the U-shaped magnetic track 110 and that is connected to an anode bus, the first storage area 111, and the second storage area 112, where the first storage area 111 is disposed between the first port 11 and the second drive circuit 30, and the second storage area 112 is disposed between the second port 12 and the first drive circuit 20. For specific structure setting, reference may be made to FIG. 1 and related content in the foregoing embodiment.

Further, the first drive circuit 20 in the storage unit 100 includes a first gate port 201, and the second drive circuit 30 includes a second gate port 301. The control method may further include:

connecting the first drive circuit 20 or connecting the second drive circuit 30 according to values of input voltages of the first gate port 201 and the second gate port 301 that are of the storage unit 100.

The storage unit 100 shown in FIG. 1 is used as an example. For the first storage area 111, if, by controlling the input voltages of the first port 11, the second port 12, the first drive port 40, and the second drive port 50, a voltage difference between two ends (that is, the first port 11 and the first drive port 40) of the first storage area 111 is greater than or equal to a voltage threshold for driving a magnetic domain to move and a voltage difference between two ends (that is, the second port 12 and the first drive port 40) of the second storage area 112 is less than the voltage threshold for driving a magnetic domain to move, and in addition, a value of a voltage of the first gate port 201 is controlled to connect the first drive circuit 20 and a value of a voltage of the second gate port 301 is controlled to disconnect the second drive circuit 30, then under driving of the first drive circuit 20, a current pulse is generated in the first storage area 111, and a magnetic domain in the first storage area 111 is driven to move, thereby completing a read operation or a write operation on the first storage area 111.

In this embodiment of the present invention, a voltage of each port of the storage unit 100 is controlled, so that the first storage area 111 and the second storage area 112 do not work at the same time, that is, a read operation or a write operation is controlled to be performed on only one storage area each time.

It may be understood that, for a control operation of the second storage area 112, reference may be made to a control process of the foregoing first storage area 111, and details are not described herein again.

Still further, the storage unit 100 further includes a write circuit 60 and a read circuit 70 that are disposed at the bottom of the U-shaped magnetic track 110, and a storage module connected to the read circuit 70. Therefore, the method may further include: performing, by the write circuit 60, a write operation on the first storage area 111 and the second storage area 112, and performing, by the read circuit 70, a read operation on the first storage area 111 and the second storage area 112; and when a magnetic domain in the first storage area 111 or the second storage area 112 moves, storing, by the storage module, data that moves out from the U-shaped magnetic track 110.

It may be understood that, for a specific operating principle of the storage unit 100, reference may be made to Table 1 and specific implementation in the foregoing application scenario, and details are not described herein again.

It can be known from the foregoing that, the method for controlling a storage unit 100 according to this embodiment of the present invention is applied to the storage unit 100 described in the foregoing embodiment, and in the method, two storage areas of the storage unit 100 are controlled and are both used for storing data, so that 2N magnetic domains can store 2N-bit data. Compared with data storage of an existing storage track, storage density is increased, and in addition, in the method, a current pulse provided by a drive circuit in the storage unit 100 is controlled and needs to drive only a magnetic domain wall of a storage area on one side of a track to move, and therefore, a drive voltage can be reduced and power consumption can also be reduced.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units . Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing provides detailed descriptions about the storage unit, the memory, and the method for controlling a storage unit that are provided in the present invention. Based on the idea of the embodiments of the present invention, a person of ordinary skill in the art can make modifications with respect to the specific implementation manners and the application scope. Therefore, the content of this specification shall not be construed as a limitation to the present invention.

What is claimed is:

1. A storage unit, comprising:
   a U-shaped magnetic track comprising,
      a first port disposed at one end of a top of the U-shaped magnetic track and connected to a cathode bus,
      a second port disposed at another end of the top of the U-shaped magnetic track and connected to an anode bus,
      a first storage area, and
      a second storage area;
   a first drive circuit connected to a first drive port and configured to drive the first storage area;
   a second drive circuit connected to a second drive port and configured to drive the second storage area;
   wherein by controlling input voltages of the first port, the second port, the first drive port, and the second drive port and driving the first drive circuit, a current pulse is generated in the first storage area, and a magnetic domain wall in the first storage area is driven to move; and
   wherein by controlling the input voltages of the first port, the second port, the first drive port, and the second drive port and driving the second drive circuit, a current pulse is generated in the second storage area, and a magnetic domain wall in the second storage area is driven to move.

2. The storage unit according to claim 1, wherein:
   the first drive circuit comprises a first gate port configured to control, according to a value of a voltage applied to the first gate port, to connect or disconnect the first drive circuit; and
   the second drive circuit comprises a second gate port configured to control, according to a value of a voltage applied to the second gate port, to connect or disconnect the second drive circuit.

3. The storage unit according to claim 1, wherein:
   the first storage area is disposed between the first port and the second drive circuit; and
   the second storage area is disposed between the second port and the first drive circuit.

4. The storage unit according to claim 1, wherein the storage unit further comprises:
   a write circuit and a read circuit disposed at a bottom of the U-shaped magnetic track, wherein the write circuit is configured to perform a write operation on the first storage area and the second storage area, and the read circuit is configured to perform a read operation on the first storage area and the second storage area.

5. The storage unit according to claim 4, wherein the storage unit further comprises:
   a storage module connected to the read circuit, wherein the storage module is configured to: when the magnetic domain wall in the first storage area or the second storage area moves, store data that moves out from the U-shaped magnetic track.

6. A memory, comprising at least one storage unit, the storage unit comprising:
   a U-shaped magnetic track comprising,
      a first port disposed at one end of a top of the U-shaped magnetic track and connected to a cathode bus,
      a second port disposed at another end of the top of the U-shaped magnetic track and connected to an anode bus,
      a first storage area, and
      a second storage area;
   a first drive circuit connected to a first drive port and configured to drive the first storage area;
   a second drive circuit connected to a second drive port and configured to drive the second storage area;
   wherein by controlling input voltages of the first port, the second port, the first drive port, and the second drive port and driving the first drive circuit, a current pulse is generated in the first storage area, and a magnetic domain wall in the first storage area is driven to move; and
   wherein by controlling the input voltages of the first port, the second port, the first drive port, and the second drive port and driving the second drive circuit, a current pulse is generated in the second storage area, and a magnetic domain wall in the second storage area is driven to move.

7. The memory according to claim 6, wherein:
the first drive circuit comprises a first gate port configured to control, according to a value of a voltage applied to the first gate port, to connect or disconnect the first drive circuit; and
the second drive circuit comprises a second gate port configured to control, according to a value of a voltage applied to the second gate port, to connect or disconnect the second drive circuit.

8. The memory according to claim 6, wherein:
the first storage area is disposed between the first port and the second drive circuit; and
the second storage area is disposed between the second port and the first drive circuit.

9. The memory according to claim 6, wherein the storage unit further comprises:
a write circuit and a read circuit disposed at a bottom of the U-shaped magnetic track, wherein the write circuit is configured to perform a write operation on the first storage area and the second storage area, and the read circuit is configured to perform a read operation on the first storage area and the second storage area.

10. The memory according to claim 9, wherein the storage unit further comprises:
a storage module connected to the read circuit, wherein the storage module is configured to: when the magnetic domain wall in the first storage area or the second storage area moves, store data that moves out from the U-shaped magnetic track.

11. A method for controlling a storage unit, the storage unit comprises a U-shaped magnetic track, a first drive circuit, a second drive circuit, a first drive port connected to the first drive circuit, and a second drive port connected to the second drive circuit, wherein the U-shaped magnetic track comprises a first port disposed at one end of a top of the U-shaped magnetic track and connected to a cathode bus, a second port disposed at another end of the top of the U-shaped magnetic track and connected to an anode bus, a first storage area, and a second storage area, wherein the first drive circuit is configured to drive the first storage area, and wherein the second drive circuit is configured to drive the second storage area, the method comprising:
in response to controlling input voltages to the first port, the second port, the first drive port, and the second drive port and driving the first drive circuit, generating a current pulse in the first storage area of the storage unit and driving a magnetic domain wall in the first storage area to move; and
in response to controlling input voltages to the first port, the second port, the first drive port, and the second drive port and driving the second drive circuit, generating a current pulse in the second storage area of the storage unit and driving a magnetic domain wall in the second storage area to move.

12. The control method according to claim 11, further comprising:
connecting the first drive circuit or connecting the second drive circuit according to values of input voltages of the first gate port and the second gate port.

\* \* \* \* \*